United States Patent [19]
Shih

[11] Patent Number: 5,767,718
[45] Date of Patent: Jun. 16, 1998

[54] HIGH SPEED CONDITIONAL SYNCHRONOUS ONE SHOT CIRCUIT

[75] Inventor: Jeng Tzong Shih, Hsinchu, Taiwan

[73] Assignee: Etron Technology, Inc., Taiwan

[21] Appl. No.: 707,403

[22] Filed: Sep. 4, 1996

[51] Int. Cl.$^6$ ............................................. H03K 3/289
[52] U.S. Cl. ............................................. 327/228; 327/203
[58] Field of Search .......................... 327/199, 200–203, 327/206, 208, 209–212, 214, 215, 217, 218, 219, 225, 227, 228, 141

[56] References Cited

U.S. PATENT DOCUMENTS

| | | | |
|---|---|---|---|
| 5,280,203 | 1/1994 | Hung et al. | 327/202 |
| 5,323,065 | 6/1994 | Ebihara et al. | 327/202 |
| 5,406,134 | 4/1995 | Menut | 327/202 |
| 5,459,421 | 10/1995 | Shaw | 327/203 |
| 5,552,738 | 9/1996 | Ko | 327/218 |

FOREIGN PATENT DOCUMENTS

| | | | |
|---|---|---|---|
| 291208 | 6/1991 | Germany | 327/202 |
| 401037114 | 2/1989 | Japan | 327/202 |
| 405067949 | 3/1993 | Japan | 327/202 |
| 405110391 | 4/1993 | Japan | 327/218 |
| 405315900 | 11/1993 | Japan | 327/202 |
| 406140885 | 5/1994 | Japan | 327/202 |

OTHER PUBLICATIONS

Sedra et al, The Latch or Data Flip–Flop, Microelectronic circuits, pp. 226–227, 1982.

*Primary Examiner*—Timothy P. Callahan
*Assistant Examiner*—My-Trang Nu Ton
*Attorney, Agent, or Firm*—Townsend & Townsend and Crew LLP; Henry K. Woodward

[57] ABSTRACT

A high speed conditional synchronous one-shot circuit includes a master flip-flop for receiving an input signal and a clock signal and generating an output signal in response to the input signal and holding the output signal while the clock signal is high, the output signal going low upon the clock signal going low. A slave flip-flop has an input for receiving the output signal from the first flip-flop and a reset terminal for receiving a reset signal when the clock signal is low, a second flip-flop generating an output signal when the clock signal is high and in response to the output signal from the first flip-flop. In another embodiment, the one-shot circuit comprises a plurality of NAND gates, each gate having a plurality of inputs and an output.

4 Claims, 8 Drawing Sheets

One embodiment of the high-speed conditional synchronous one shot circuit

One way to implement conditional synchronous one shot circuit

Timing Diagram of Fig. 1

One example timing Diagram of Fig. 3

One embodiment of the high-speed conditional synchronous one shot circuit

Timing Diagram of Fig. 5

Another embodiment of high-speed conditional synchronous one shot circuit

Timing Diagram of Fig. 7

1
HIGH SPEED CONDITIONAL SYNCHRONOUS ONE SHOT CIRCUIT

BACKGROUND OF THE INVENTION

This invention relates generally to a one-shot electrical circuit which generates an output electrical pulse of predetermined length in response to an input signal, and more particularly the invention relates to a high speed one-shot electrical circuit which generates an output electrical pulse which is synchronized to a clock signal.

The synchronous one-shot electrical circuit is used in many synchronous electronic systems such as memories, CPUs, microprocessors, logic control circuits, communications circuits, and the like. A number of circuits have been designed to provide the synchronous one-shot output, such as the circuit of FIG. 1. In FIG. 1 a D flip-flop 10 receives an input signal and a clock signal and generates an output QB when the input and clock signal are both high. QB and the inverted clock from inverter 12 are applied to a NOR gate 14 which generates the one-shot output. FIG. 2 illustrates the timing diagram for the circuit. The clock is delayed by chain 16 to prevent any glitch at the output if QB goes high after the clock goes high. Thus, this prior art circuit has a large propagation delay.

The present invention is directed to a synchronous one-shot circuit which has a higher operating speed.

SUMMARY OF THE INVENTION

Briefly, in accordance with the invention a high speed conditional synchronous one-shot circuit includes a master flip-flop for receiving an input signal and a clock signal and generating an output signal in response to the input signal and holding the output signal while the clock signal is high, the output signal going low upon the clock signal going low. A slave flip-flop has an input for receiving the output signal from the first flip-flop and a reset terminal for receiving a reset signal when the clock signal is low, the slave flip-flop generating an output signal in response to the output signal from the first flip-flop and when the clock signal is high.

More particularly, in accordance with one embodiment of the invention, the master flip-flop comprises a first transfer gate serially connected with a first bidirectional inverter, and the slave flip-flop comprises a second transfer gate serially connected with a second bidirectional inverter. The master input terminal is connected to the first transfer gate, and means operably connects the clock signal to control the first transfer gate and the second transfer gate. Output of the first bidirectional inverter is coupled through the second transfer gate to an input of the second bidirectional inverter, the slave output terminal connected to the output of the second bidirectional inverter. A reset transistor periodically applies a reset voltage to the input to the second bidirectional inverter in response to the clock signal.

In another embodiment, the high speed conditional synchronous one-shot circuit comprises a plurality of NAND gates, each gate having a plurality of inputs and an output. An input signal is connected to an input of a first NAND gate, and a clock signal is applied to inputs of second and third NAND gates, with the inputs and outputs of the NAND gates interconnected whereby second and third NAND gates generate one-shot signals in response to the input signal being low at the rising edge of the clock and when the input signal is high at the rising edge of the clock, each of the output pulses being synchronized to the clock signal.

The invention and objects and features thereof will be more readily apparent from the following detailed description and dependent claims when taken with the drawings.

2
BRIEF DESCRIPTION OF THE DRAWINGS

DETAILED DESCRIPTION OF ILLUSTRATED EMBODIMENTS

Figure 1:
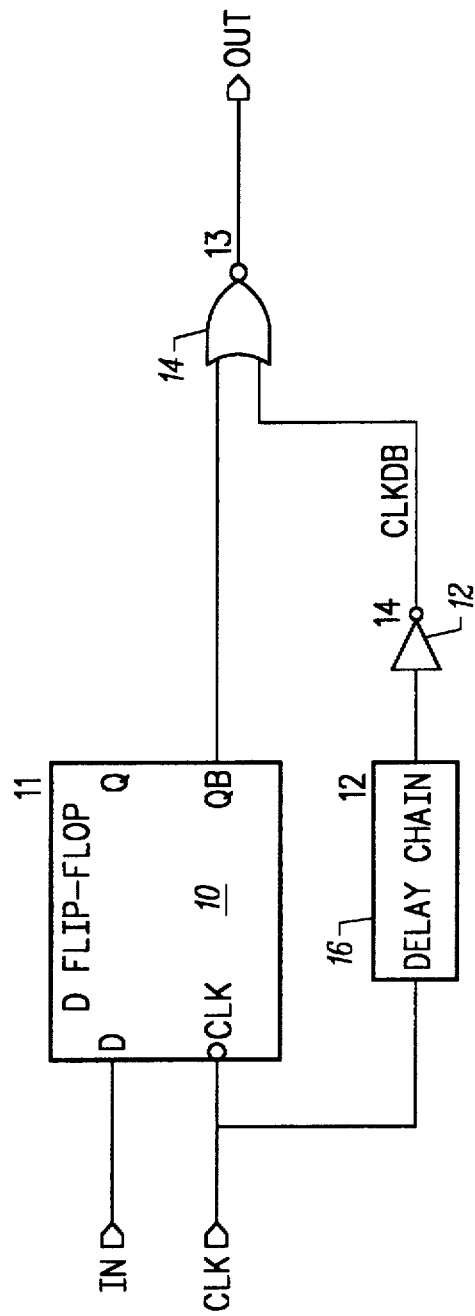
FIG. 1 is a functional block diagram of a synchronous one-shot circuit in accordance with the prior art.
Figure 2:
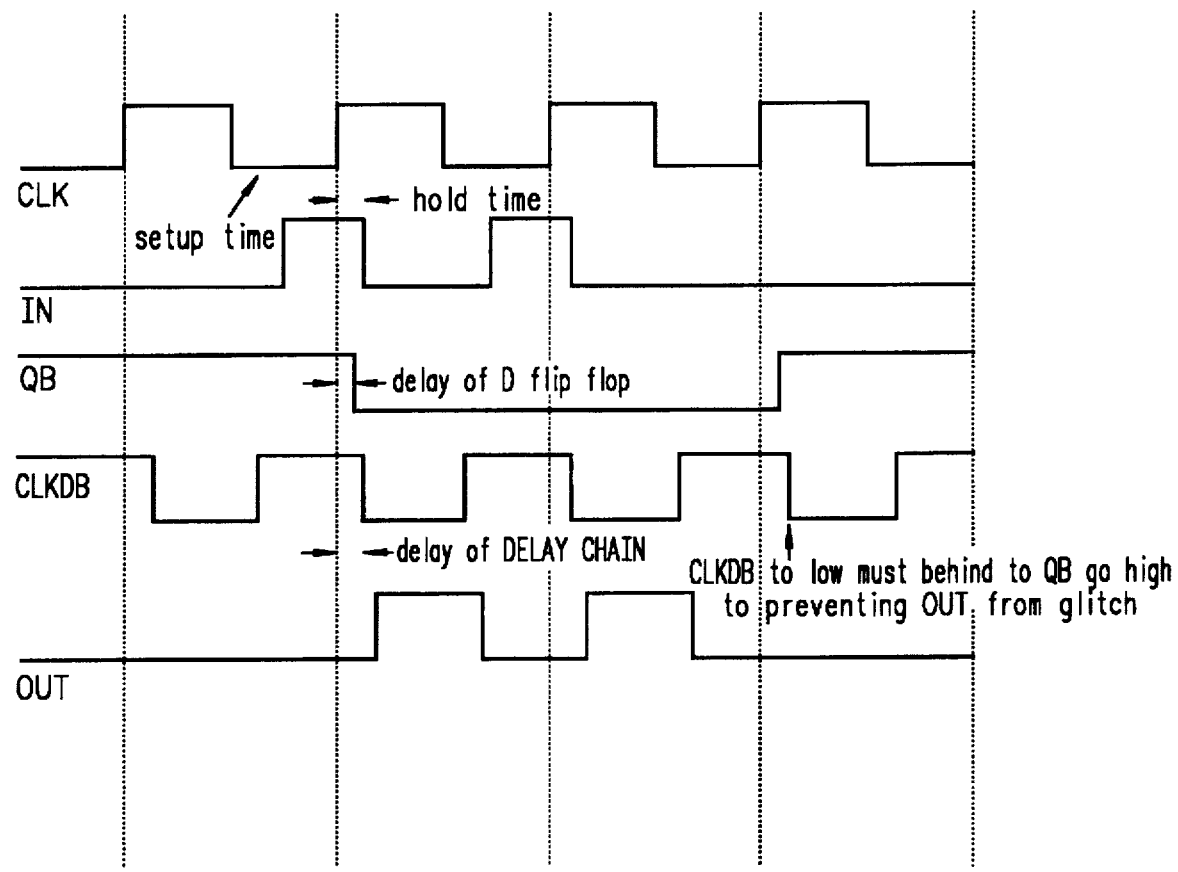
FIG. 2 is a timing diagram for the circuit of FIG. 1.
Figure 3:
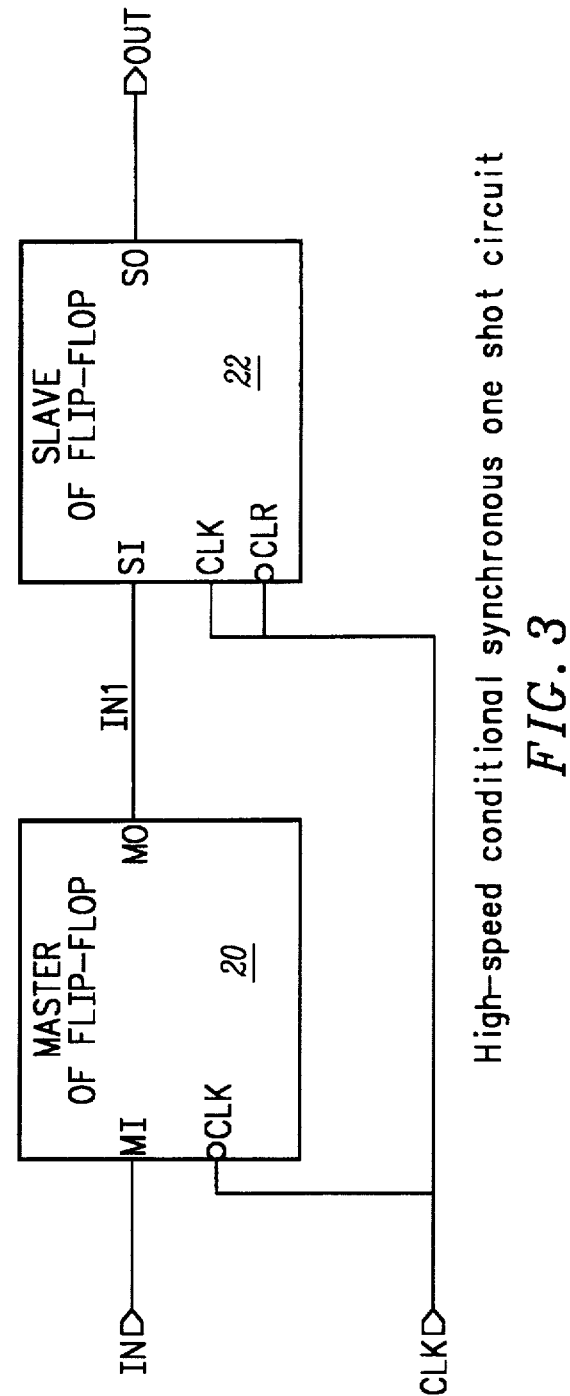
FIG. 3 is a functional block diagram of a high speed conditional high speed synchronous one-shot circuit in accordance with one embodiment of the invention.

Referring now to the drawings, FIG. 3 is a functional block diagram of a high speed conditional synchronous one-shot circuit in accordance with the invention. A master flip-flop 20 includes a master input, MI, and a master output, MO, along with a clock input, CLK. A slave flip-flop 22 has a slave input, SI, a slave output, SO, and clock input and a clear input. The clock input is applied to the clock terminals of both flip-flops and to the clear terminal of the slave flip-flop, and the output of the master flip-flop, MO, is connected to the input of the slave input, SI.

Figure 4:
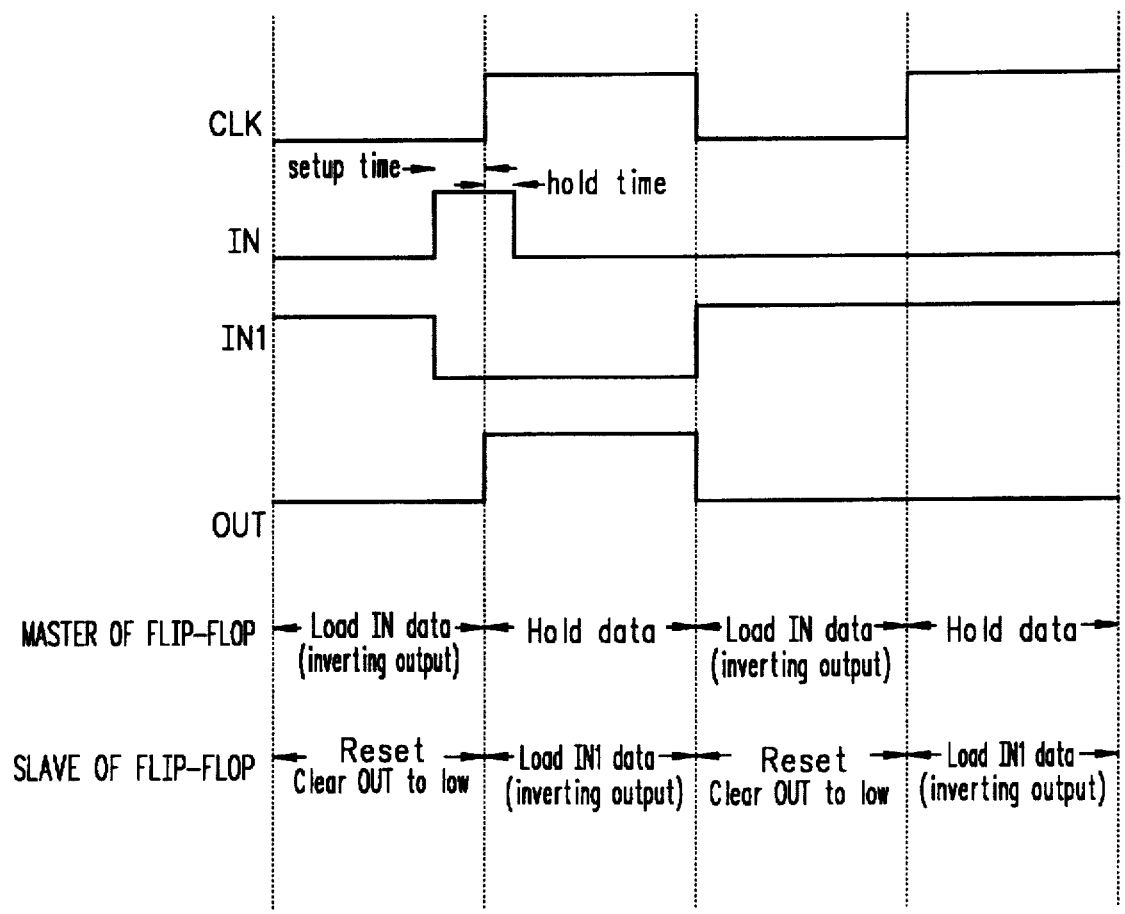
FIG. 4 is a timing diagram for the circuit of FIG. 3.

This circuit has fewer components than the prior art and the propagation delay is just the delay of the two flip-flops. As shown in the timing diagram of FIG. 4, the master flip-flop 20 latches input data when the clock is low and holds the input while the clock is high. The slave flip-flop latches input data when the clock is high and resets the input when the clock is low. Therefore, a one-shot signal will be generated from the output of the slave flip-flop when the input to the master flip-flop is high at the leading edge of the clock signal.

Figure 5:
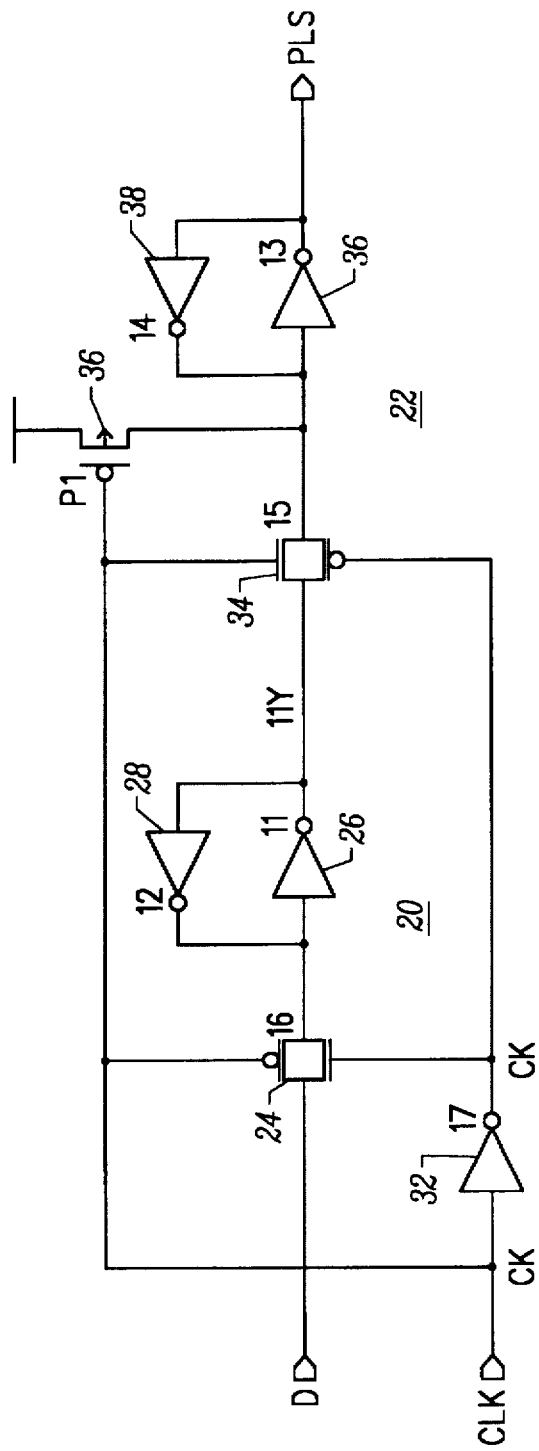
FIG. 5 is a more detailed schematic of the high speed conditional synchronous circuit of FIG. 3.
Figure 6:
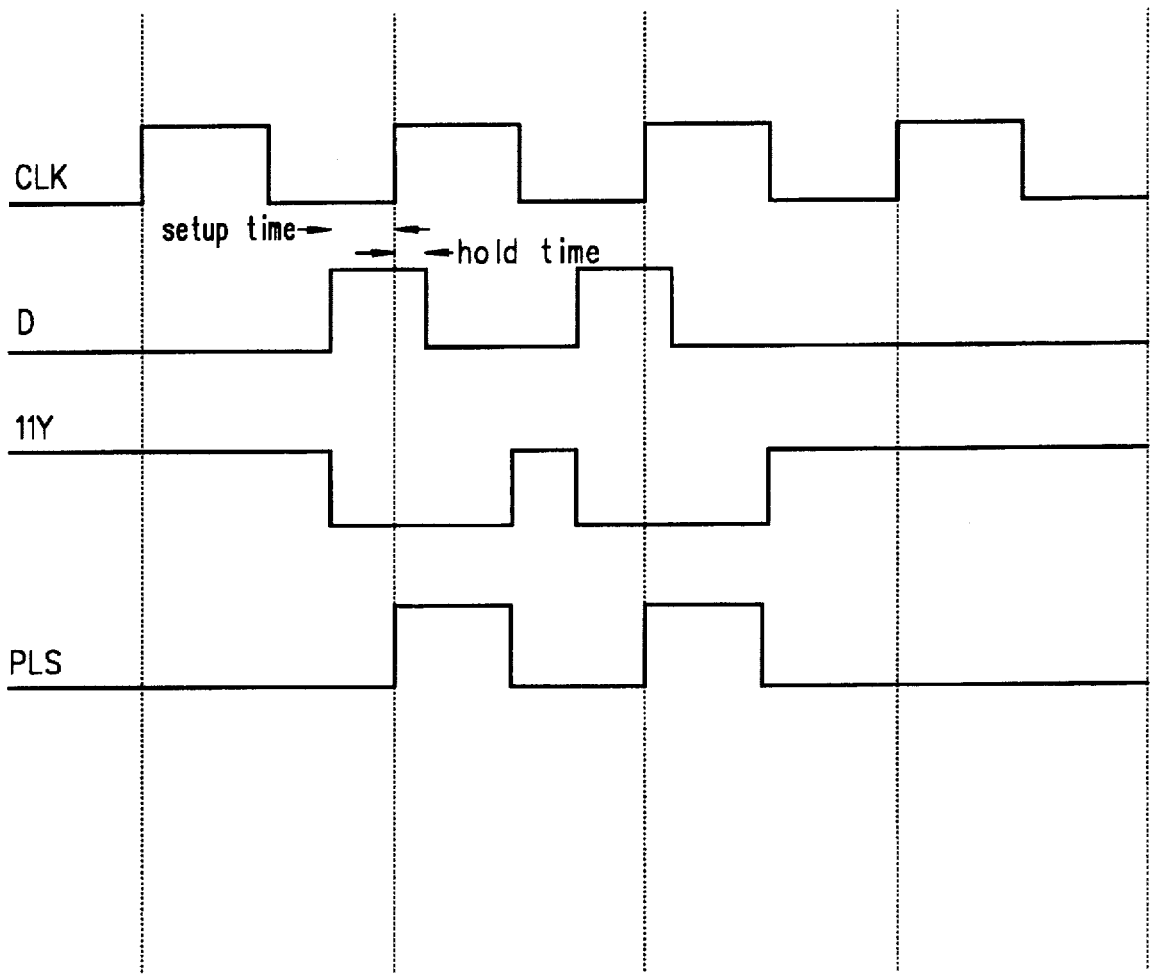
FIG. 6 is a timing diagram for the circuit of FIG. 5.

FIG. 5 is a schematic of one embodiment of the one-shot circuit of FIG. 3. The master flip-flop 20 comprises transmission gate 24, and bidirectional inverters 26, 28. The slave flip-flop 22 comprises transmission gate 34 and inverters 36, 38 which comprise a second bidirectional inverter. The transfer gates and inverters comprise CMOS transistor pairs. A P channel transistor 30 provides a reset signal to the input of the slave flip-flop 22. The clock signal is applied directly to the transfer gates 24, 34 and through inverter 32 to the transfer gates 24, 34 for controlling the transmission of signals through the CMOS gates. The clock signal also controls the gate of reset transistor 30. Again, the master flip-flop 20 will latch the input when the clock is low and hold the input when the clock is high. The slave flip-flop 22 latches the output of the master flip-flop when the clock is high and resets the input when the clock is low, therefore, a one-shot signal will be generated when the input is high at a positive edge of the clock. The timing diagram is shown in FIG. 6.

Figure 7:
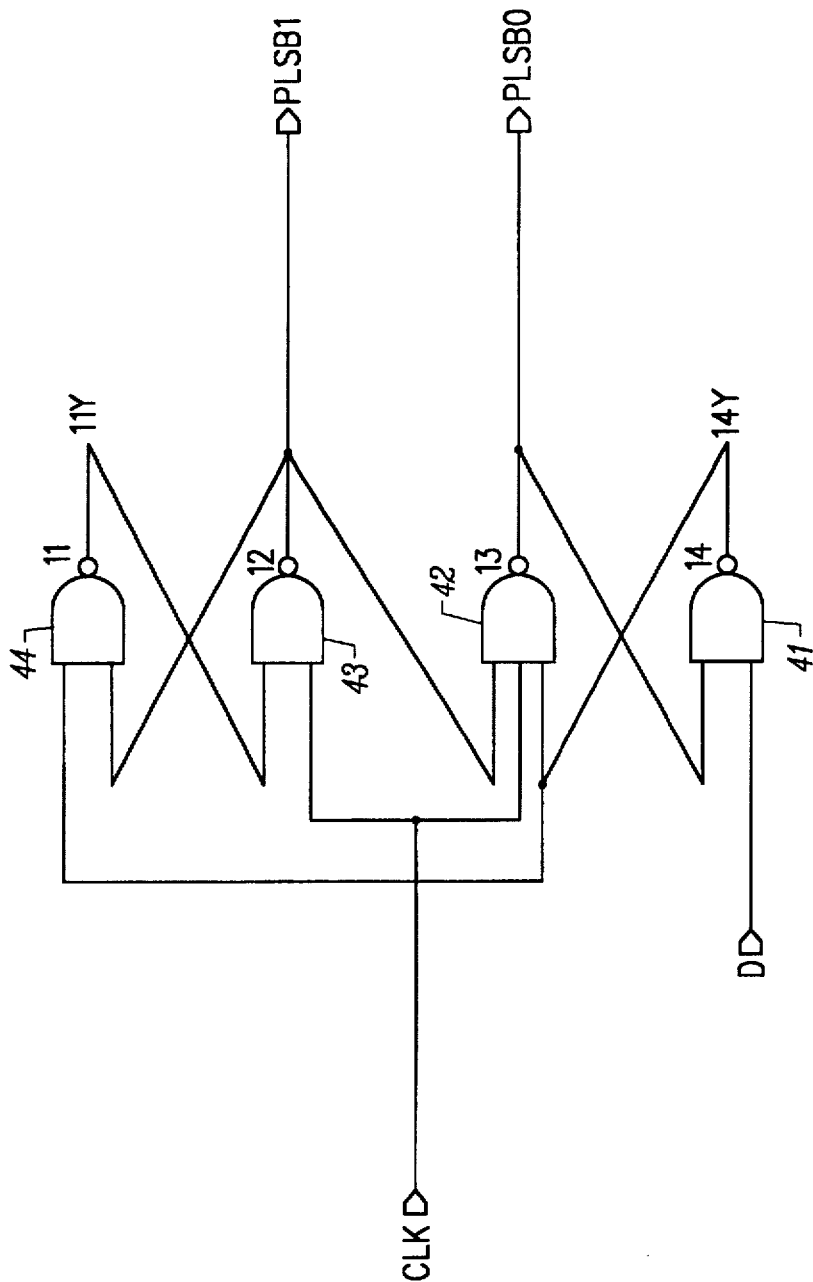
FIG. 7 is a schematic of a high speed conditional synchronous one-shot circuit in accordance with another embodiment of the invention.
Figure 8:
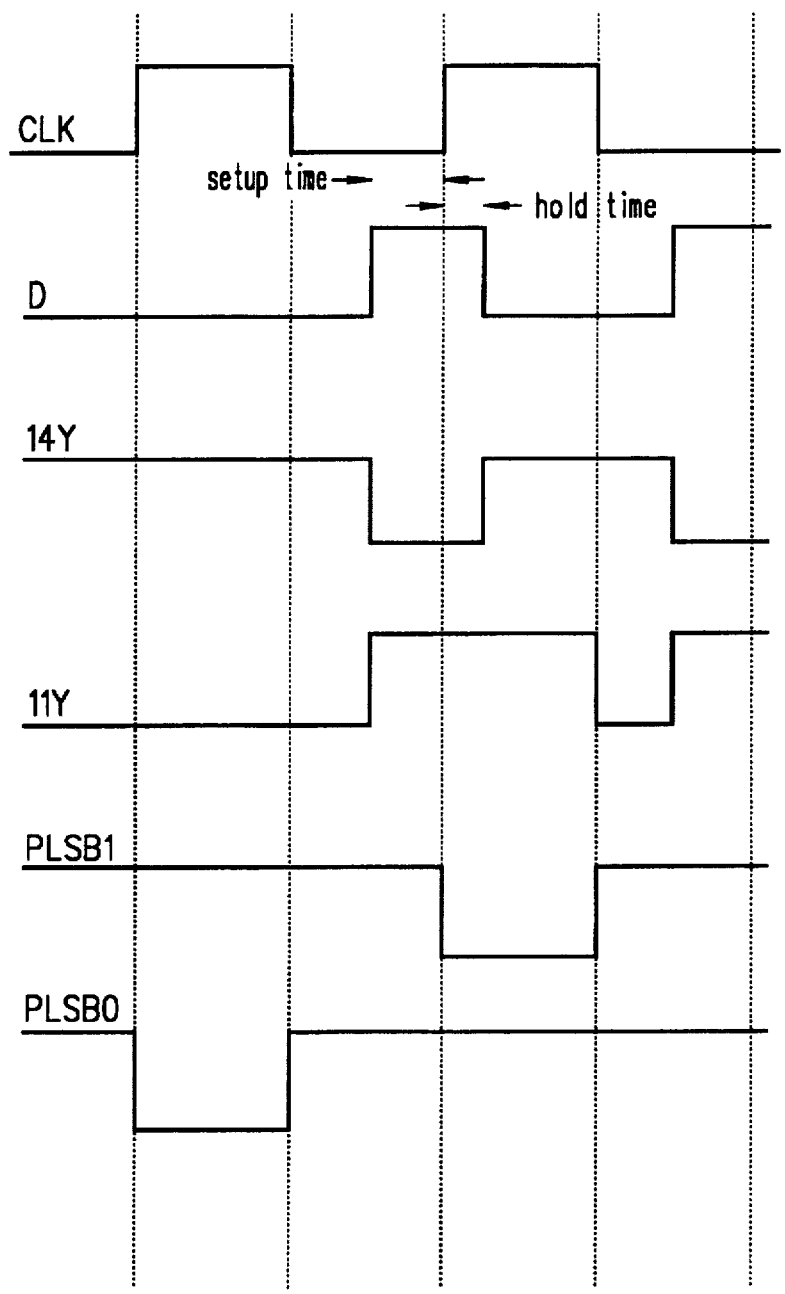
FIG. 8 is a timing diagram for the circuit of FIG. 7.

FIG. 7 is a schematic of another embodiment of a high speed conditional synchronous one-shot circuit in accordance with the invention. In this embodiment, the one-shot circuit comprises four NAND gates with inputs and outputs interconnected to generate a one-shot signal when the input is low at a leading edge of the clock and another one-shot signal when the input is high at a leading edge of the clock.

More particularly, the one-shot circuit includes multiple input AND gates 41, 42, 43, 44 with the D input connected to one input of NAND gate 41 and the clock input applied to input terminals of NAND gates 42, 43. The output of the NAND gate 42 is connected to a first output terminal and to an input of the first NAND gate 41, and the output of the first NAND gate 41 is connected to an input of the NAND gate 42. The output of third gate 43 is connected to a second output terminal and to an input of the second NAND gate 42. A fourth NAND gate 44 has a first input connected to the output of the first NAND gate 41 and a second input connected to the output of the third NAND gate 43. The output of the fourth NAND gate 44 is applied as an input to the third NAND gate 43. The output of the second NAND gate 42 is generated when the D input is low at the leading edge of the clock signal, and the output of the third NAND gate 43 is generated when the D input is high at a leading edge of the clock signal. Both output signals are synchronized to the clock signal.

The high speed conditional synchronous one-shot circuits in accordance with the invention have smaller propagation delays in generating a one-shot output signal. The devices have fewer components and are easier to implement in integrated form than the prior art. Further, two one-shot outputs can be generated, one for the input being high and the other for the input being low at the leading edge of a clock signal.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A high speed conditional synchronous one-shot circuit comprising a master flip-flop having a master input terminal, a master clock terminal, and a master output terminal, the master flip-flop generating a master output signal at the master output terminal in response to an input signal at the master input terminal while a clock signal at the master clock terminal is low and latching the master output signal while the clock signal is high, and a slave flip-flop having a slave input terminal, a slave clock terminal, a slave reset terminal responses to the clock signal, and a slave output terminal, the slave flip-flop generating an output signal at the slave output terminal in response to an input signal at the slave input terminal and when the clock signal at the slave clock terminal is high, said master flip-flop comprising a first transfer gate serially connected with a first bidirectional inverter, said slave flip-flop comprising a second transfer gate serially connected with a second bidirectional inverter, said master input terminal connected to said first transfer gate, means operably connecting the clock signal to control said first transfer gate and said second transfer gate, an output of said first bidirectional inverter coupled through the second transfer gate to an input of the second bidirectional inverter, the slave output terminal connected to an output of said second bidirectional inverter, and a reset transistor periodically applying a reset voltage to the input to the second bidirectional inverter in response to the clock signal.

2. The one-shot circuit as defined by claim 1 wherein the transfer gates and the bidirectional inverters comprise CMOS transistor pairs.

3. The one-shot circuit as defined by claim 2 wherein said means operably connecting the clock signal to the transfer gates includes an inverter for inverting the clock signal.

4. The one-shot circuit as defined by claim 3 wherein the reset transistor comprises a P channel enhancement mode transistor having a gate connected to receive the clock signal, the P channel enhancement mode transistor applying the reset voltage to the input of the second bidirectional inverter in response to the clock signal transitioning low.

* * * * *